(12) United States Patent
Kim et al.

(10) Patent No.: US 6,429,679 B1
(45) Date of Patent: Aug. 6, 2002

(54) PROGRAMMABLE IMPEDANCE CONTROL CIRCUIT AND METHOD THEREOF

(75) Inventors: Nam-Seog Kim, Seoul; Uk-Rae Cho, Suwon, both of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/853,101

(22) Filed: May 10, 2001

(30) Foreign Application Priority Data

Nov. 2, 2000 (KR) .............................. 00-64830

(51) Int. Cl.[7] .......................................... H03K 19/003
(52) U.S. Cl. ........................................ 326/30; 326/82
(58) Field of Search .............................. 326/30–32, 82, 326/86–87

(56) References Cited

U.S. PATENT DOCUMENTS

| | | | |
|---|---|---|---|
| 5,666,078 A | * | 9/1997 | Lamphier et al. ........... 327/108 |
| 5,973,520 A | | 10/1999 | Maruyama |
| 6,049,221 A | | 4/2000 | Ishibashi et al. |
| 6,060,907 A | | 5/2000 | Vishwanthaiah et al. |
| 6,064,224 A | | 5/2000 | Esch, Jr. et al. |
| 6,087,847 A | * | 7/2000 | Mooney et al. ............... 326/30 |
| 6,087,853 A | | 7/2000 | Huber et al. |
| 6,091,260 A | | 7/2000 | Shamarao |

* cited by examiner

Primary Examiner—Michael Tokar
Assistant Examiner—James H. Cho
(74) Attorney, Agent, or Firm—F.Chau&Associates,LLP

(57) ABSTRACT

A programmable impedance control circuit for detecting a characteristic impedance of transmission line to thereby output it to an output driver and on-chip terminator in a semiconductor device. Particularly the circuit serves to control an internal impedance according to a controlled, programmable protocol irrespective of the changes in an external impedance due to factors such as voltage and temperature after an initial internal impedance is set during a locking operation.

22 Claims, 16 Drawing Sheets

PROGRAMMABLE IMPEDANCE CONTROL CIRCUIT AND METHOD THEREOF

BACKGROUND OF THE INVENTION

1. Technical Field

The present invention relates generally to an impedance control circuit of a semiconductor device for detecting a characteristic-impedance of a transmission line and matching the impedance to the impedance of an output driver and an on chip terminator. In particular, the present invention is directed to a programmable impedance control circuit and method for controlling the impedance in a controlled, programmable manner, irrespective of a variation of an external impedance subsequent to a locking operation in which an internal impedance of an integrated circuit (IC) chip is set to the external impedance, thereby maintaining a reliable and stable system.

2. Description of the Related Art

Recently, the use of various "on-chip" termination techniques have been employed for use in interface circuitry for high-speed data transmission in digital circuit designs. Such termination techniques include, for example, series termination, source termination, and parallel termination, and each of these techniques has advantages and disadvantages associated therewith. For instance, one advantage of series termination (which comprises a resistor between the output of a driver and the interface line) is that its termination resistor consumes less power than all other resistive termination techniques. With parallel termination (which comprises a resistor connected between one end of a transmission line and ground (or voltage source VCC)), one advantage is that good signal-integrity is maintained, although the swing level of a signal may be lowered (i.e., the high-output level of the signal may be degraded) due to minor dc power dissipation in the termination resistor. With a source termination approach, the impedance of the transmission line is matched by the impedance of a source driver.

One method for employing on-chip termination comprises transmitting (in full swing) data through a transmission line wherein an output driver performs source termination and a receiver performs parallel termination. To implement this method, it is desirable that the output driver and the on-chip termination be implemented with a resistor. With this approach, however, because the output driver and the on-chip termination are preferably disposed within a chip, the desired termination cannot be obtained when the characteristic impedance of the transmission line varies. Thus, the circuit should be constructed such that a desired value for the characteristic-impedance could be set in a program. For this purpose, an impedance control circuit is utilized to detect a characteristic impedance of a transmission line and transmits the result to the output driver and the on-chip termination.

A programmable impedance control circuit serves to match an internal impedance of a chip (e.g., impedance of an output driver) according to a resistance value of an externally connected resistor, for example. In addition, the circuit provides a mechanism for matching an internal impedance to an external impedance by actively updating a digital code during a predetermined period in response to variances in voltage and temperature.

FIGS. 1a and 1a are diagrams that illustrate a conventional impedance control circuit and its operation characteristics, respectively. The conventional impedance control circuit of FIG. 1a employs a scheme (as illustrated in FIG. 1b) in which a locking operation is implemented when an external resistance value is uniformly maintained (a first steady state occurs) and a tracking operation is implemented to actively follow variations in the external resistance value after the locking operation to adjust the internal impedance. One problem associated with the conventional scheme is that the impedance may be abruptly changed even at the constant external resistance value when the tracking operation is actively performed in response to any changes in the external conditions (voltage, or temperature) after a locking operation. Such an abrupt change in impedance causes a failure in its entire system operation.

During normal operation of the input termination and output driver, however, the voltage and temperature typically do not abruptly vary from system condition under which the input termination and output driver were set (i.e., locked). Therefore, the possibility that the programmable impedance control circuit instantaneously may fail in its operation in response to an external noise is not significant. Accordingly, a system and method for controlling the impedance in a programmable manner, irrespective of variations of the impedance of an external coupling (e.g., transmission line) is highly desirable. Indeed, it would be considered a safe transmission method in the entire system either to have the impedance code "locked" in the original operation and continuously maintained without a tracking operation during operation of the chip, or to track a regular code, by one or two codes out of the initial locked codes, during a code updating after setting of codes, even if the tracked codes change significantly.

SUMMARY OF THE INVENTION

Accordingly, in order to solve the aforementioned problems, an object of the present invention is to provide a programmable impedance control circuit by which a locking operation is first implemented to set an internal impedance (e.g., impedance of an output driver) to match an external impedance (e.g., characteristic impedance of a transmission line) during a first mode of operation in the system environment and wherein a programmable tracking operation is performed to adjust the internal impedance to the external impedance according to a preprogrammed protocol.

Another object of the present invention is to provide a programmable impedance control circuit by which a preprogrammed protocol for tracking comprises continuously maintaining a locked code value after the locking operation irrespective of detected changes in the external impedance, or by which tracking is performed subsequent to the locking operation by adjusting the internal impedance by no more than a predetermined number of code values from the initial locked code value in response to changes in the external impedance during operation of the chip.

Still another object of the present invention is to provide a programmable impedance control circuit in which the impedance of transmission line is controlled in a programmable way by separating a locking operation and a tracking operation using digital code or time.

In one aspect of the present invention, a method for providing impedance control to match an external impedance to an internal impedance of an integrated circuit chip comprises the steps of:

detecting an impedance control signal indicative of an external impedance value;

performing a locking operation to detect a locked state and output a corresponding locked code value to set an initial internal impedance, upon detecting a first occurrence of a steady code sequence in the impedance control signal for a first predetermined cycle; and performing a preprogrammed tracking operation in response to a variation of an external impedance subsequent to the locking operation.

In another aspect, a preprogrammed tracking operation comprises maintaining the locked code value irrespective of variations of the external impedance subsequent to the locking operation.

In yet another aspect, the preprogrammed tracking operation comprises adjusting the value of the initially set internal impedance by no more than a predefined number of code values from the locked code value.

In another aspect, the preprogrammed tracking operation comprises performing the tracking operation at a clock frequency that is lower than a clock frequency at which the locking operation is performed.

In yet another aspect, the preprogrammed tracking operation comprises maintaining the locked code value and then changing the locked code value to an updated code value after detecting an occurrence of a steady code sequence in the impedance control signal for a second predetermined cycle subsequent to the locking operation.

In another aspect, the impedance control method is preferably implemented for matching the characteristic impedance of a transmission line to the impedance of an output driver.

In still another aspect of the present invention, a programmable impedance control circuit comprises:

a first circuit for processing a plurality of reference voltages to generate an impedance control signal and for performing a locking operation to detect a locked state and output a corresponding locked code value upon detecting a first occurrence of a steady code sequence in the impedance control signal for a first predetermined cycle; and a second circuit for storing the locked code value output from the first circuit and for performing a preprogrammed tracking operation in response to a variation in an external impedance subsequent to the locking operation.

These and other objects, features and advantages of the invention will become more apparent from the following detailed description of the preferred embodiment made with reference to the accompanying drawings:

DETAILED DESCRIPTION OF PREFERRED EMBODIMENTS

Figure 1A:
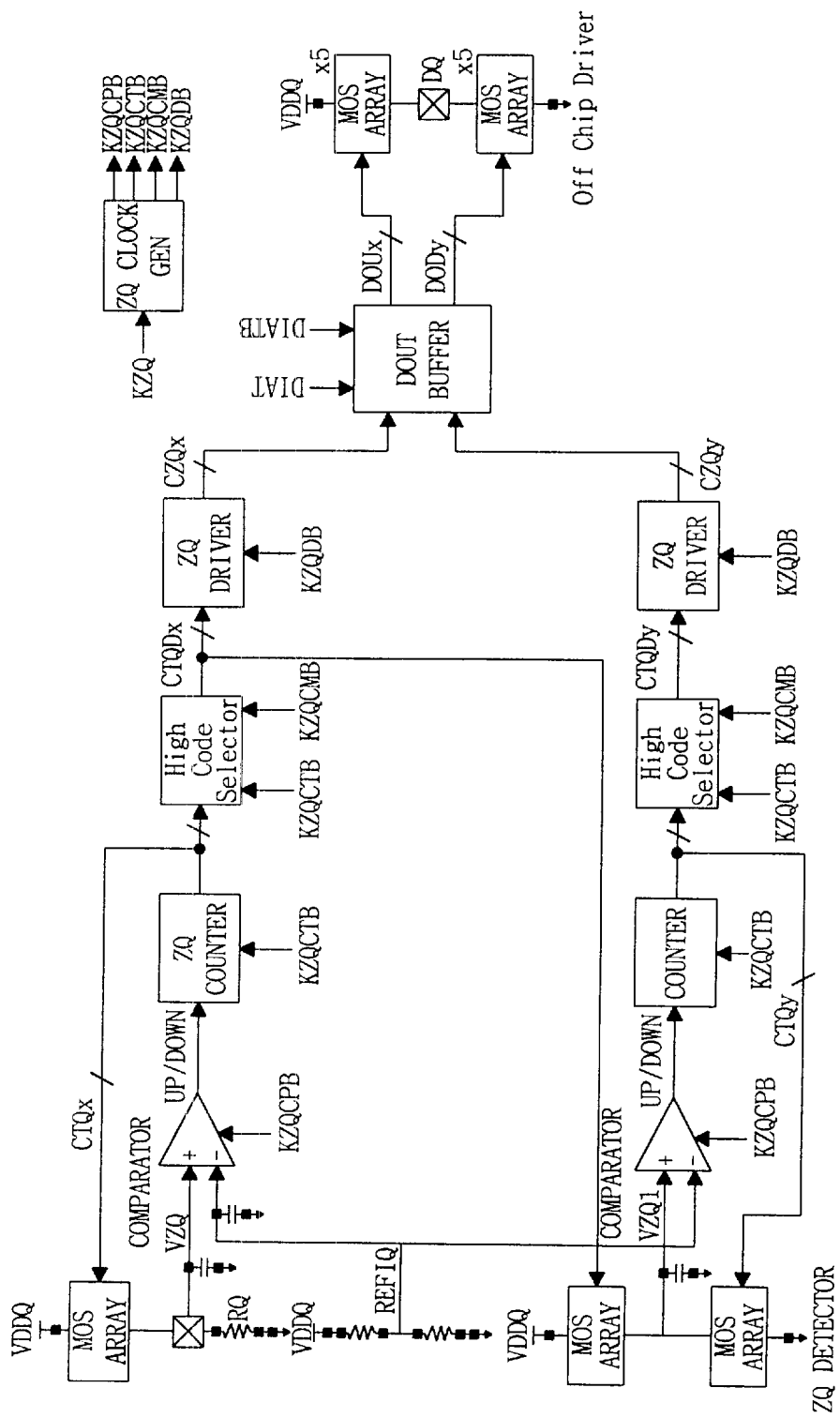
FIGS. 1a and 1a are block diagrams illustrating a conventional impedance control circuit and its operation characteristics.
Figure 1B:
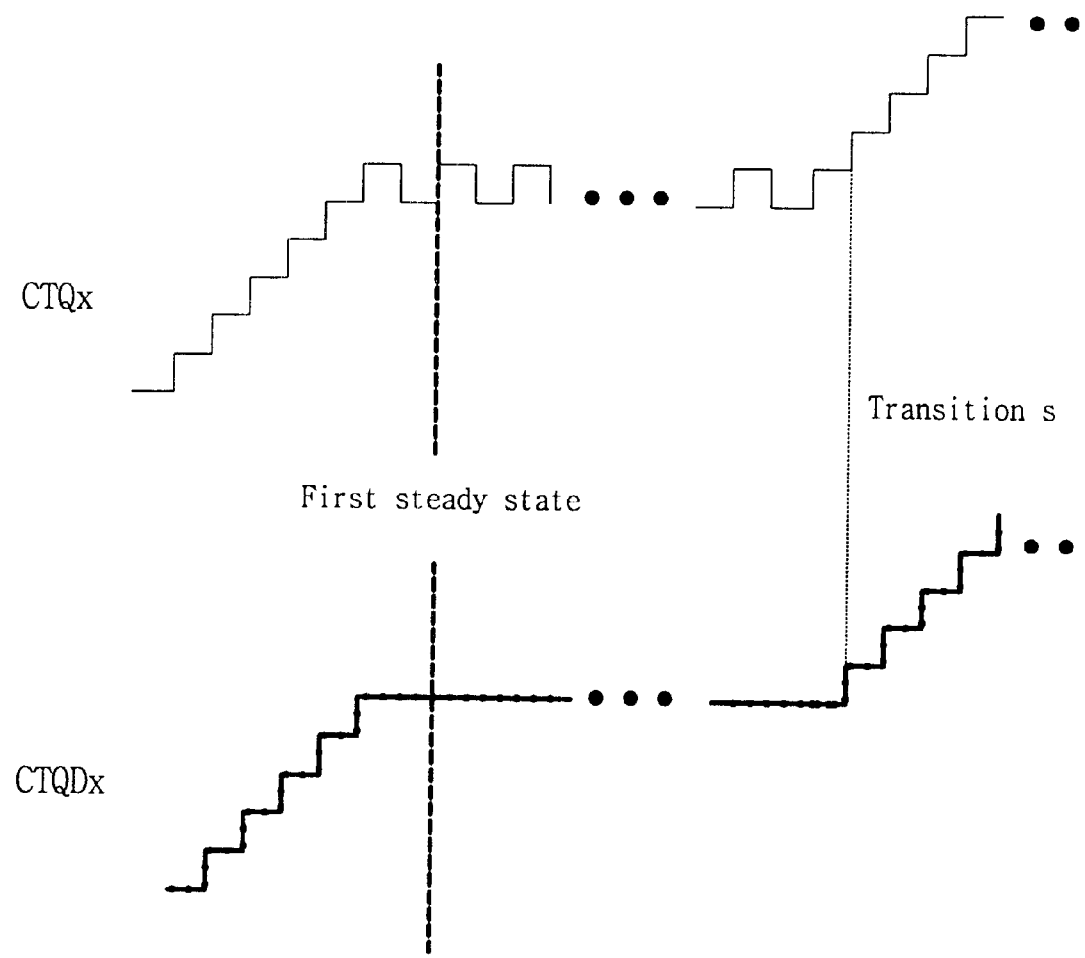
Figure 2A:
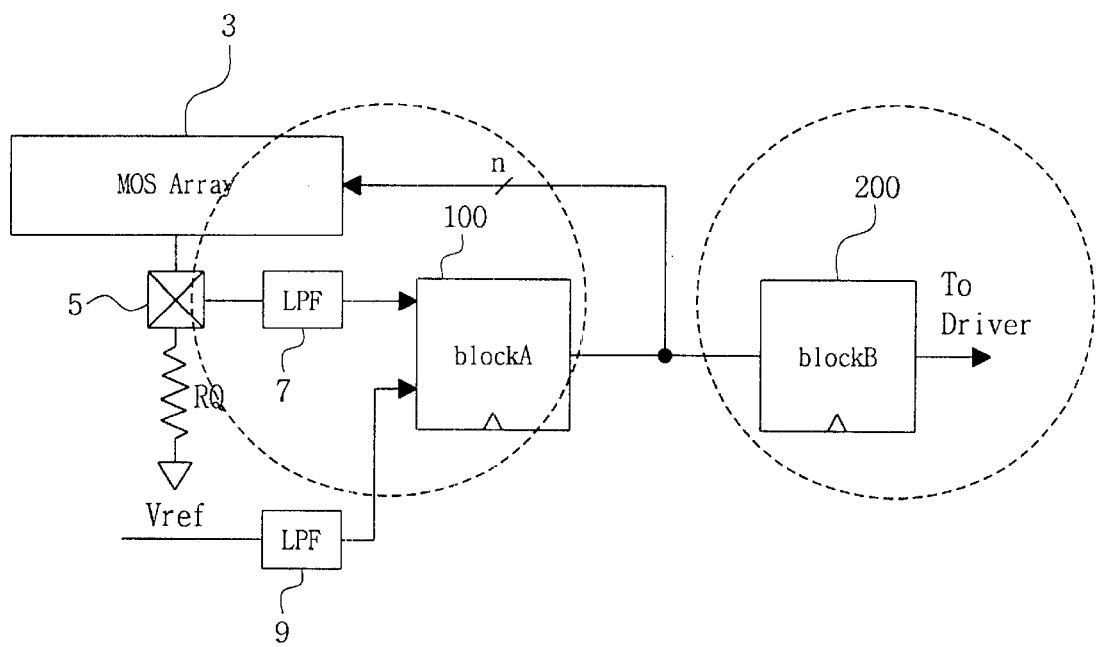
FIG. 2a is high-level block diagram of an impedance control circuit according to an embodiment of the present invention.

In the following description of preferred embodiments, the term "locking" refers to a state when a programmable impedance control circuit initially detects a steady-state external resistance value (e.g., an initial state when an internal driver impedance is determined to be substantially equal to an external resistance). Further, the term "tracking" refers to the process of actively following an external resistance value in response to an external change after the "locking" state (e.g., after locking, an internal driver impedance is adjusted to substantially match an external resistance.) Technical features of a programmable impedance control circuit according to the present invention will be explained in general with reference to FIGS. 2 to 7. FIG. 2a is a high-level diagram illustrating an impedance control circuit according to an embodiment of the present invention. In general, the programmable impedance control circuit transfers an impedance of transmission line to an output device to match an external impedance to an internal impedance.

The control circuit comprises a first block 100 for comparing the reference voltage Vref with a voltage on pad 5. An external impedance, e.g., resistor RQ, and an impedance of a MOS array 3 establish the voltage on pad 5. The MOS array comprises a plurality of transistors that are enabled/disabled by a feedback control signal from block 100 wherein combinations of such transistors are selectively enabled by the feedback control signal to change the effective resistance of the MOS array 3 and make the pad voltage substantially equal to the reference voltage. The pad voltage passes through a first low pass filter 7 to the first block 100 and the reference voltage Vref passes through a second low pass filter 9 to the first block 100. The pad voltage is determined based on the combination of the MOS array 3 and the external resistance RQ. In response to the comparison, the first block 100 outputs a resultant signal that is provided to the MOS array 3 via a feedback loop 3. In addition, the block 100 performs a counting up/down operation in response to the resultant signal. The first block 100 detects a code signal resulting from the counting, to detect a locked state and output the locked code value upon the first occurrence of a constant code signal for a predetermined sequencing cycle.

A second block 200 is provided for storing the locked code output from the first block 100 and transferring such code to the output driver. Further, the second block 200 performs a tracking operation of the locked code (which differs from the tracking operation performed by the first block 100) in response to changes in the external environment (voltage, temperature, etc.) after the locking operation. The tracking in the second block 200 differs from the tracking in the first block 100 in that the tracking is performed with a frequency that is different from that of the first block 100 after locking, or that a digital code value of the second block 200 is different from that of the first block 100 after the initial locking.

Block 100 receives an output signal from the pad 5 disposed between the MOS array 3 and the external resistor RQ connected to the ground. Block 200 and the MOS Array 3 receive an n-bit output signal from the block 100. The MOS array continues to receive an n-bit output signal from the block A 100 to adjust the effective resistance of the MOS array and change the pad voltage. The block 100 receives an output signal that is output from the pad 5 and passes through the low pass filter LPF 7 and an output signal of the reference voltage Vref of a chip that passes through the low pass filter 9.

Figure 2B:
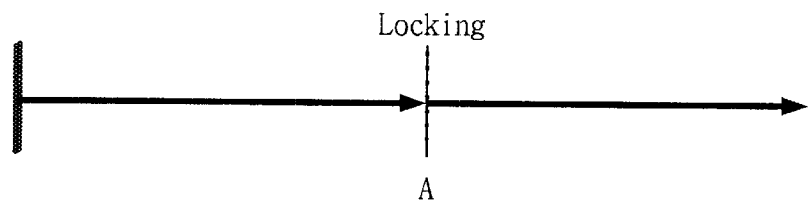
FIG. 2b is a diagram illustrating an operational mode of an impedance control circuit according to one aspect of the present invention.

The impedance control circuit of FIG. 2 performs impedance matching via operation of block 100 and block 200. FIG. 2b is a diagram illustrating an operational mode of the impedance control circuit of FIG. 2a according to one aspect of the present invention. A locking is implemented at point "A" when a steady code is first detected. After locking, tracking is performed beyond point "A". With a conventional method, block 200 would actively perform a tracking operation after locking when any changes in block 100 are generated due to changes in the external environment such as voltage or temperature (i.e., a tracking operation is performed even when an undesirable change is generated). In contrast, in accordance with a tracking operation according to the present invention, block 200 maintains the locked code value or allows the locked code value to vary by one or several code values from the initial locked code value, irrespective of any changes in block 100. In other words, the locking operation performed by block 100 and the tracking operation performed by block 200 in the programmable control circuit are separate operations. As explained below, the separation of operation of blocks 100 and 200 are preferably based on digital codes or time.

Figure 3:
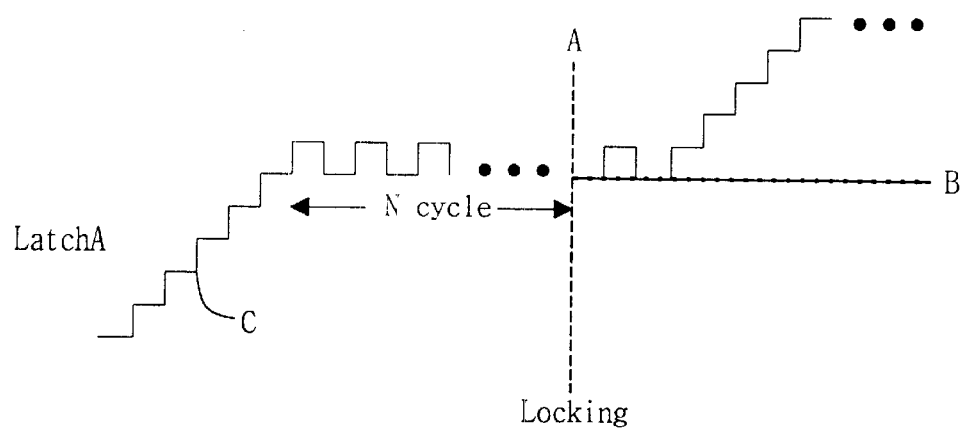
FIG. 3 is a diagram illustrating an operational mode of an impedance control circuit according to another aspect of the present invention.

Referring now to FIG. 3, a diagram illustrates an impedance control operation of the programmable impedance control circuit according to one aspect of the present invention. In particular, FIG. 3 illustrates an example of one mode of operation wherein no tracking is performed after locking.

As the code value "C" (associated with an external resistance value) in latch A increases, a locked state is entered at point A when a steady code value is detected for a predetermined number of cycles (i.e., N cycles). Once the code is locked, code "B" is set to indicate an impedance value and this code is locked and invariable. Thus, in the embodiment of FIG. 3, there is no tracking operation.

Figure 4A:
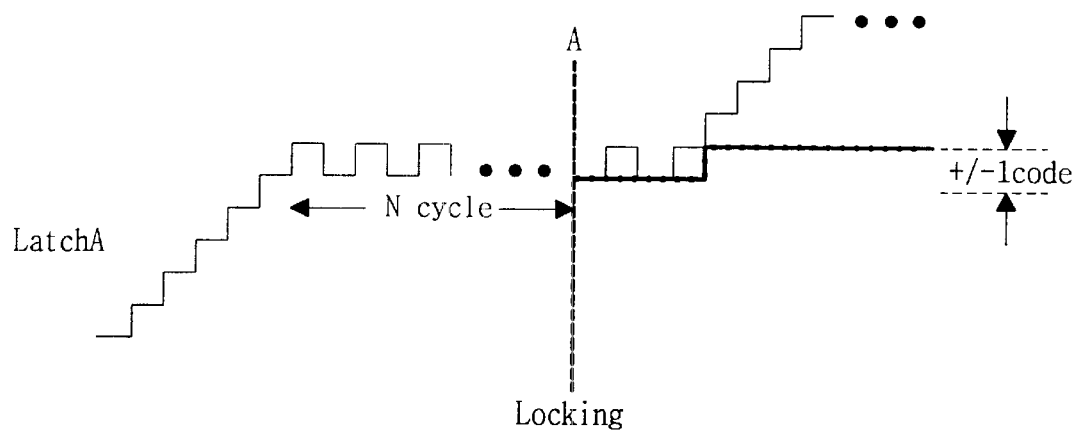
FIGS. 4a and 4b are diagrams illustrating operational modes of an impedance control circuit according to other aspects of the present invention.
Figure 4B:
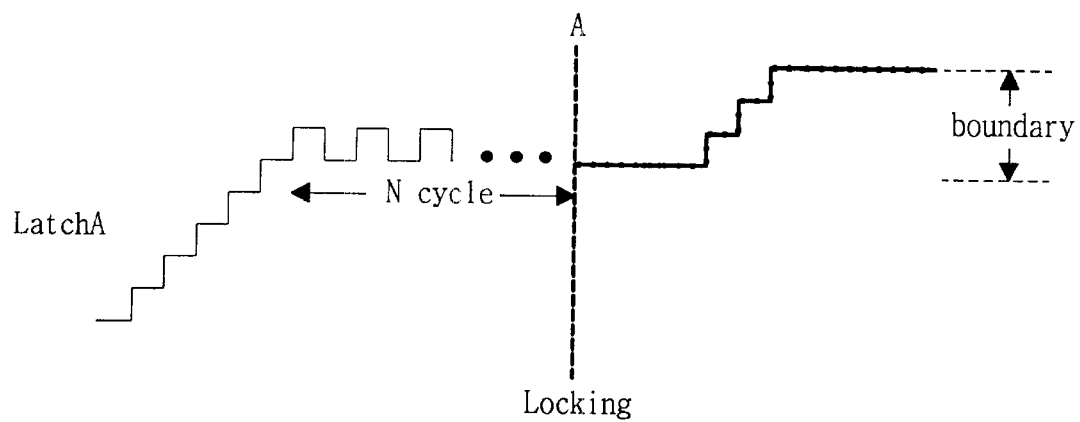

Referring now to the diagrams of FIGS. 4a and 4b, an impedance control operation of the programmable control circuit according to another aspect of the present invention is shown. In particular, FIGS. 4a and 4b illustrate methods for performing minimal tracking wherein after a locking operation, the value of the locked code varies in a programmable controlled manner based on an external environment change. For instance, FIG. 4a illustrates a tracking operation wherein the impedance is adjusted by no more than +/− one code value from the locked code value. Further, FIG. 4b illustrates a tracking operation wherein an impedance is adjusted by a limited, predetermined number of code values from the locked code. (i.e., tracking is bounded within limited code values). For example, as shown in FIG. 4b, tracking is limited to three codes. It is to be understood that FIGS. 3 and 4 illustrate impedance control operations using a digital code.

Figure 5A:
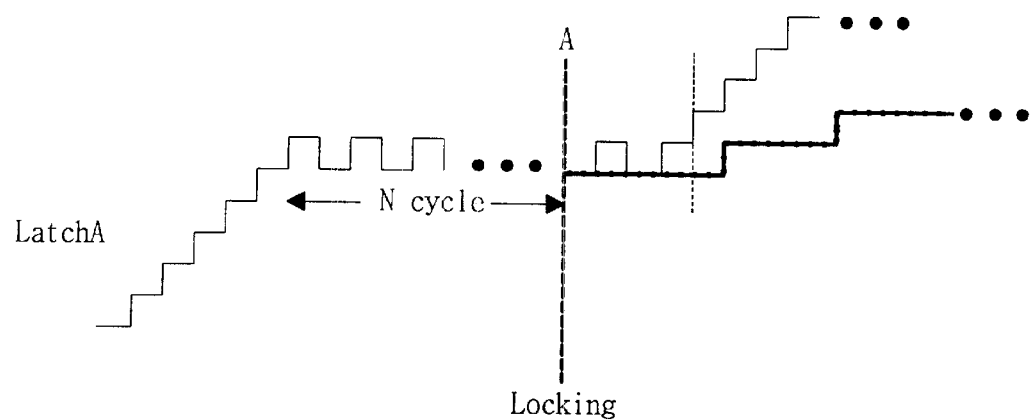
FIGS. 5a and 5b are diagrams illustrating operational modes of an impedance control circuit according to yet other aspects of the present invention.
Figure 5B:
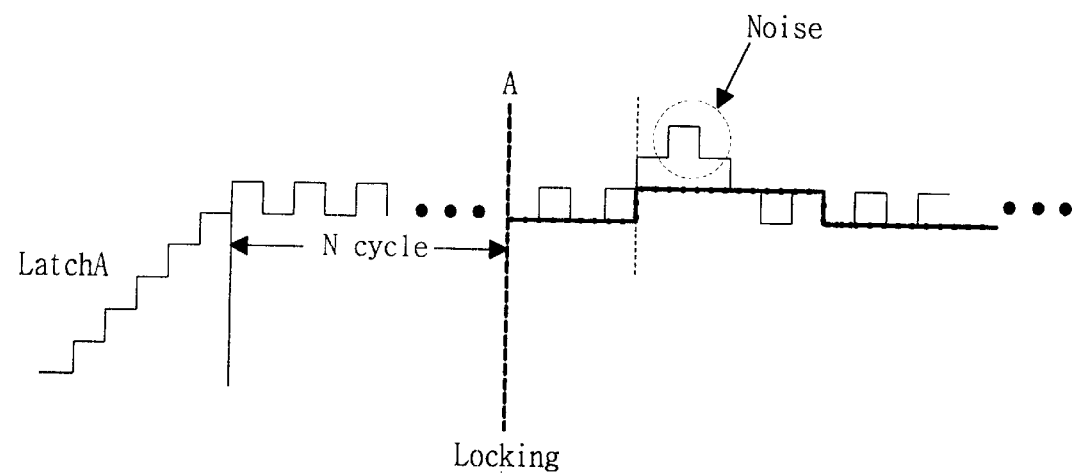

FIGS. 5a and 5b are diagrams illustrating an impedance control operation for the programmable impedance control circuit according to another aspect of the present invention. In particular, FIGS. 5a and 5b illustrate impedance control mechanisms that are based on time (frequency). In particular, when the external environment changes after the locked point "A", the tracking of the locked code is gradually performed via a time control. By performing tracking in a gradual manner in response to changes in the external environment, the impedance control is less prone abrupt changes such as noise (as shown, for example, in FIG. 5b). As explained below in detail, this is achieved by performing the tracking operation at a clock frequency that is lower than the clock frequency used for the locking operation.

Figure 6:
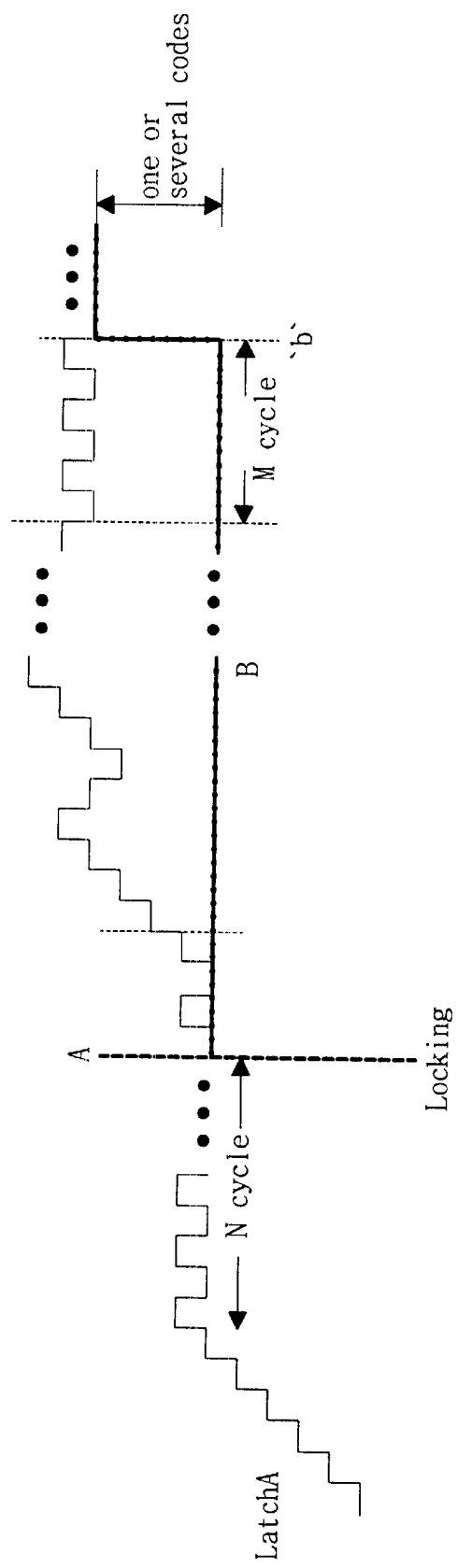
FIG. 6 is a diagram illustrating an operational mode of an impedance control circuit according to another aspect of the present invention.

FIG. 6 is a diagram illustrating an impedance control operation of the programmable impedance control circuit in accordance with yet another aspect of the present invention. In FIG. 6, tracking in the impedance control operation is abruptly implemented in a region where a steady sequencing cycle exists after locking. More specifically, after point "A" where a locking is implemented, a tracking operation will not be implemented even though an external resistance varies. However, when a constant code value of M cycles occurs (indicating a state in which the external resistance value becomes stable), tracking is implemented by locking (at point b') the code value (associated with the external resistance value) in the steady cycle.

Figure 7:
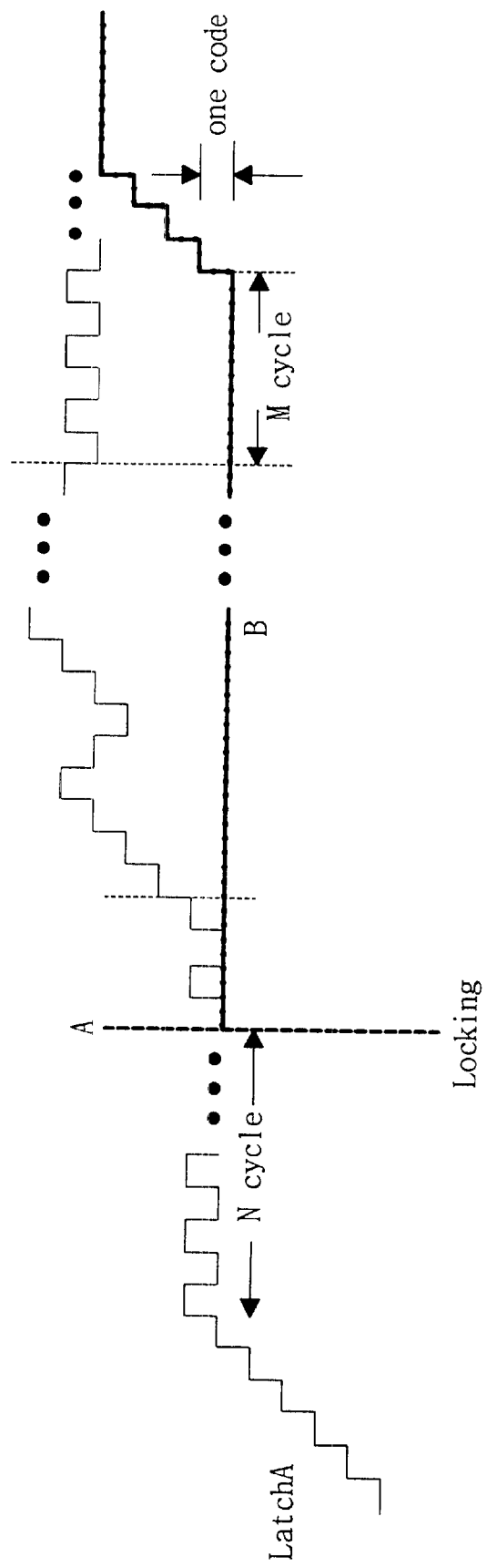
FIG. 7 is a diagram illustrating an operational mode of an impedance control circuit according to yet another aspect of the present invention.

FIG. 7 is a diagram illustrating an impedance control operation of the programmable impedance control circuit according to another aspect of the present invention. In particular, an impedance control operation is shown in which after locking, a tracking is gradually performed by one code during a steady sequencing cycle. In particular, after point "A" where a locking is implemented, a tracking operation will not be implemented even though an external resistance varies. However, when a constant code value of M cycles occurs (indicating state in which the external resistance value becomes stable), a tracking operation is gradually implemented one code level at a time to the code value level associated with the external resistance value. The gradual impedance control operation of FIG. 7 provides more stability than the abrupt tracking operation shown in FIG. 6.

As described in the above, one advantageous feature of a programmable impedance control circuit according to the present invention is that the locking and tracking operations of blocks 100 and 200 (shown in FIG. 2) are separate and independent. Further, the present invention provides a tracking mechanism that limits tracking in a controlled manner even though an external environment changes after a locking operation.

Accordingly, in one aspect of the present invention, a method in a programmable impedance control circuit for transferring an impedance of transmission line to an output driver to match an external impedance with an internal impedance of a chip comprises the steps of generating a counting code signal by comparing a reference voltage with a pad voltage, wherein the pad voltage is derived from a combination of a MOS array and an external resistor, detecting a locked code and locking a corresponding code value, which is output to an output driver, when a first constant sequencing block of code is maintained during a predetermined cycle, and gradually performing a programmable tracking operation in response to an external impedance change during a tracking operation responding to the external impedance change after the locking step.

As noted above, the step of gradually performing a programmable tracking operation can be performed using one of a plurality of methods according to the present invention. In one embodiment, the code value that is locked is maintained and set as an invariant value irrespective of a change of the external impedance after the locking operation. The locked code is output to an output driver for effecting a match of an internal impedance. In another embodiment, after the locking operation, a tracking operation is performed by a limited number of code values that vary from the initial locked code value, in response to a change in the external impedance after the locking operation. In a further embodiment, the tracking operation is implemented with a slower frequency than the locking operation in response to the impedance change after the locking operation. In yet another embodiment, the locked code is maintained in response to the external impedance change after the locking operation, thereafter the external impedance becomes a stable code value, and then the tracking operation is performed so that the locked code becomes the stable code value. In another embodiment, the tracking operation is implemented so that the locked code abruptly becomes a stable code value. In yet another embodiment, when the locked code becomes a stable code value, the tracking is gradually performed to the stable code value by one code out of the locked code values.

Figure 8:
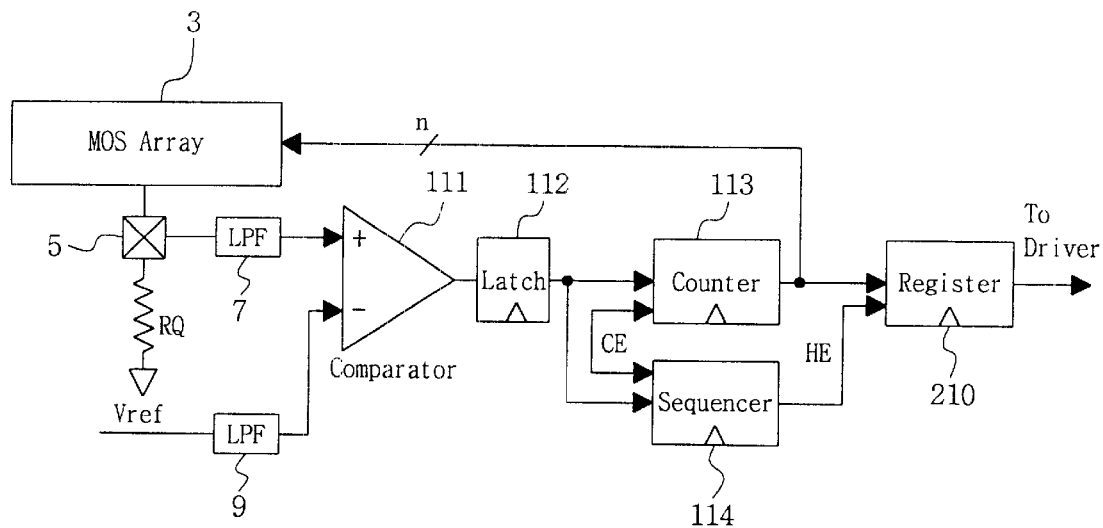
FIG. 8 is a block diagram illustrating a programmable impedance control circuit according to an embodiment of the present invention.
Figure 9:
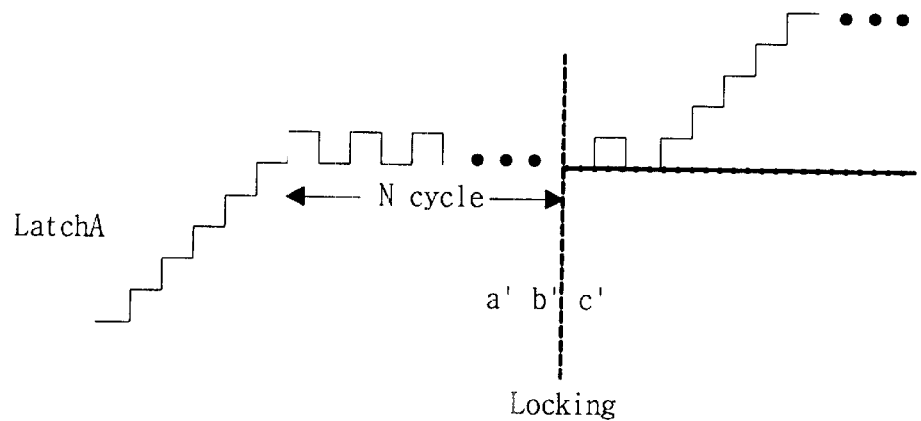
FIG. 9 is a diagram illustrating a mode of operation of the programmable impedance control circuit of FIG. 8.

Referring now to FIG. 8, a block diagram illustrates a programmable impedance control circuit according to one embodiment of the present invention. FIG. 9 is a diagram illustrating an operational mode of the circuit of FIG. 8. The programmable impedance control circuit according to the present invention comprises a comparator 111 for comparing a reference voltage Vref with a voltage of pad 5 (which is generated from a voltage division between a MOS array 3 and an external resistance RQ) and outputting a resultant signal to a latch 112. The latch 112 stores the resultant signal output from the comparator 111 and outputs the stored signal to a counter 113. The counter 113 performs and up/down counting operation in response to the value outputted from the latch 112 and then outputs a code signal resulting from the counted value. The code signal output from the counter 113 is input to the MOS array 3 and a register 210. A sequencer 114 detects a locked state when a steady sequencing code is first encountered during a predetermined cycle and upon detecting the locked state, the sequence 114 generates a signal (CE) that is output to the counter 113 to terminate the operation of the counter 113. A register 210 is enabled in response to a locking detecting signal (HE) output from the sequencer 114. The register 210 receives and stores a locked code value from the counter 113 and then transfers the locked code value to an output driver.

During operation of the circuit of FIG. 8, the comparator 111 receives a first input signal, which is outputted from the pad 5 located between the MOS array 3 and the external resistor RQ connected to both the MOS array 3 and the ground voltage, and which is passed through the low pass filter 7. The comparator 111 receives a second input signal resulting from a reference voltage Vref in a chip that passes through the low pass filter 9. The latch 112 receives a compared signal output from the comparator 111. The counter 113 is connected to the output of the latch 112 to output the counted value to the MOS array 3 and the hold register 210. The sequencer 114 is connected to the output of latch 112 to output a counter enabling signal CE to the counter 113 and to output the hold register enabling signal HE (i.e., a locking detecting signal) to the register 210. The register 210 receives output signals of the counter 113 and the sequencer 114.

The programmable impedance control circuit as shown in FIG. 8 implements a scheme whereby after an external resistance value is first detected and locked, a tracking operation is not performed and the locked value is maintained. The locking operation compares the reference voltage Vref with the voltage of the pad 5 resulting from a combination of the MOS array 3 and the external resistance RQ to thereby increase or decrease the combinations of the transistors in the MOS array 3 to adjust the effective resistance generated by the array. Thereby, n bits in the combination of the MOS array 30 is determined so that the pad voltage becomes the nearest value with the reference voltage Vref. When a steady code value is detected by the sequencer 114, a locked state is detected, the hold register enable signal HE is disabled so that n bit value at that time is stored in the register 210. And at the same time the counter enabling signal CE is disabled thereby terminating the operation of the counter 113. Consequently, a tracking operation is terminated when the first locked value is stored in the register 210.

FIG. 9 is a diagram that illustrates an operational mode of the circuit of FIG. 8. A period a' denotes a time period in which a sequence of constant code values during N cycles is obtained, period b' denotes the time at which the locked state is detected and the signals CE and HE output from the sequencer 114 are disabled, and period c' illustrates that a locked code value is maintained even though the external resistance value varies after the locking period b'. In other words, in the programmable impedance control circuit of FIG. 8, a code value is fixed when a locking is implemented during the first occurrence of a stable cycle, and no tracking operation is performed even when the external resistance value changes. It is to be understood that the programmable impedance control circuit shown in FIG. 8 can be employed with an up driver and a down driver.

Figure 10:
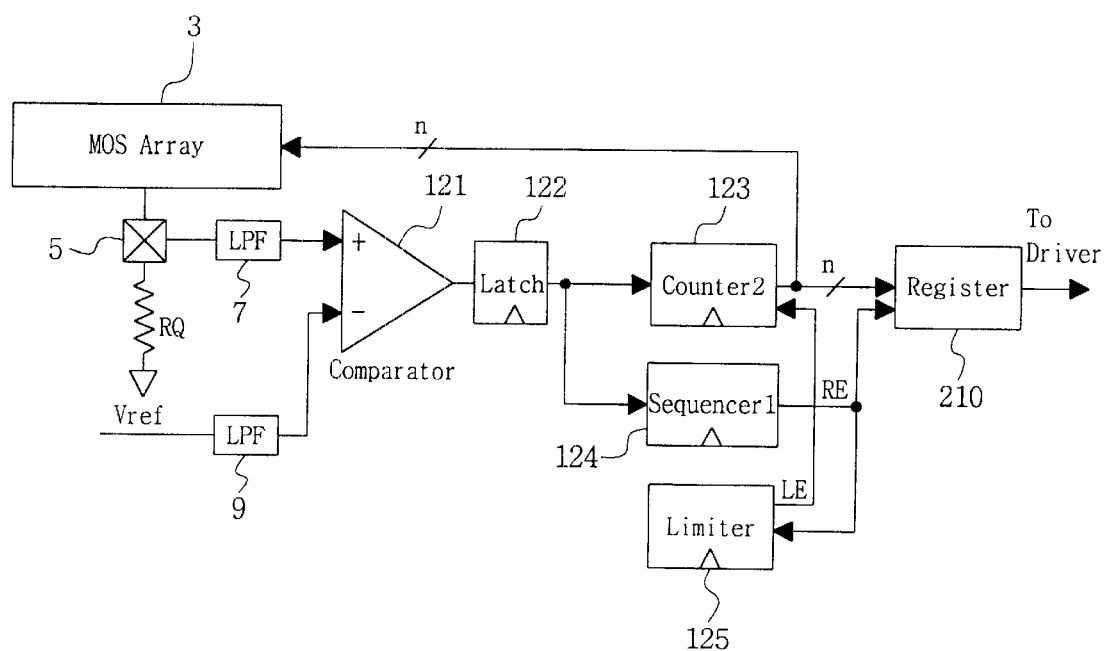
FIG. 10 is a block diagram of a programmable impedance control circuit according to another embodiment of the present invention.
Figure 11:
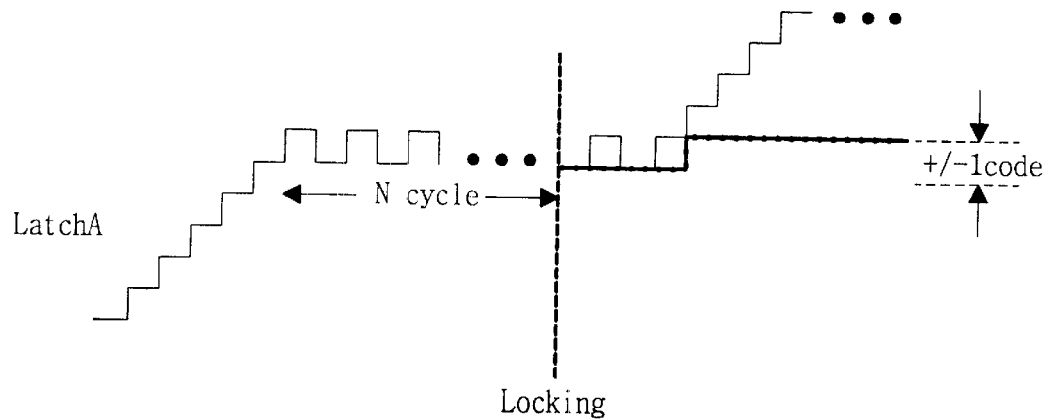
FIG. 11 is a diagram illustrating an operational mode of the programmable impedance control circuit of FIG. 10.
Figure 12:
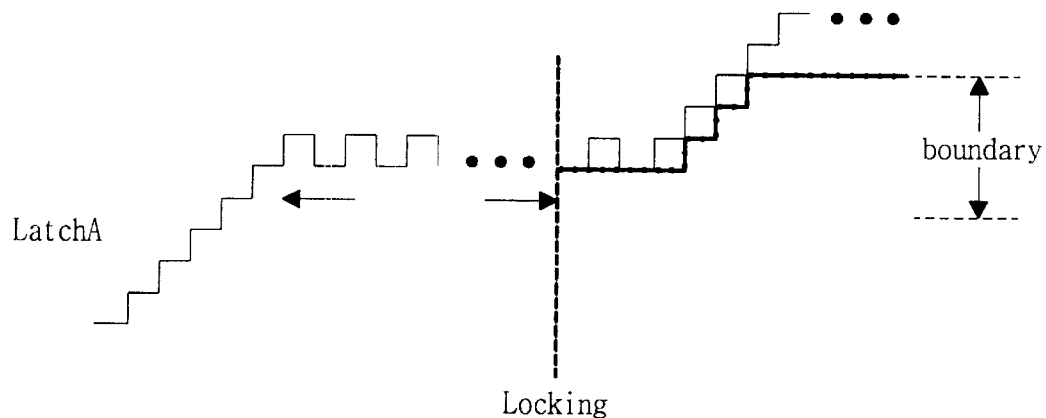
FIG. 12 is a diagram illustrating another operational mode of the programmable impedance control circuit of FIG. 10.

FIG. 10 is a block diagram of a programmable impedance control circuit according to another embodiment of the present invention. FIGS. 11 and 12 are diagrams illustrating operational modes of the circuit of FIG. 10. The programmable impedance control circuit of FIG. 10 comprises a comparator 121 for comparing a reference signal Vref with the voltage of the pad 5 resulting from a combination of the MOS array 3 and the external resistance RQ and generating a resultant signal in response to such comparison. A latch 122 stores the resultant signal output from the comparator 121 and outputs the stored signal to a counter 123. The counter 123 performs an up/down counting operation in response to the value output from the latch 122 and then outputs the counted value as a code signal. A sequencer 124 is provided for detecting a locked state upon the first occurrence of a steady sequencing code during a predetermined cycle, and then outputs a locking detecting signal RE. A limiter 125 is enabled by the locking detecting signal RE output from the sequencer 124. The limiter 125 controls operation of the counter 123 so that a tracking operation is performed within a limited amount of codes from the initial locked code. The limiter 125 generates a signal LE for disabling the counter 123 when the tracking is performed within the predetermined limit. A register 210, which is enabled in response to the locking detecting signal RE output from the sequencer 124, receives a code value at the time of the locking from the counter 123 to stores such code value. The register 210 transfers the locked code value and the tracked code to an output driver.

During operation, the comparator 121 receives a first input, which is output from the pad 5 located between the MOS array 3 and the external resistor RQ connected to both the MOS array 3 and the ground voltage, and which is passed through the low pass filter 7. The comparator 111 receives a second input signal resulting from a reference voltage Vref in a chip that passes through the low pass filter 9. The latch 122 receives a compared signal of the comparator 121. The counter 123 is connected to an output of the latch 112 to output the counted value to the MOS array 3 and the hold register 210. The sequencer 124 is connected to an output of the latch 122 to receive the output value of the latch 122 and to output the hold register enable signal (locking detection signal RE) to the register 210. The register 210 receives the outputs of the counter 123 and the sequencer 124. The limiter 125 is enabled by the hold register enable signal RE and outputs a signal LE for disabling operation of the counter 123.

The programmable impedance control circuit of FIG. 10 performs a locking operation that is similar to the locking operation performed by the programmable impedance control circuit of FIG. 8, except that the embodiment of FIG. 10 utilizes a limiter 125 that limits the locking by a limited amount of codes output from the counter 123. For example, if the counter 123 continuously implements an "up" counting operation by a limited code value only in a locking operation, the limiter 125 enables the signal LE to terminate the operation of the counter 123, thereby discontinuing the tracking operation. Preferably, the limited code value is one code (±1 code) as shown in FIG. 11, or several codes within a predetermined boundary as shown in FIG. 12, thereby gradually performing a tracking. As such, after locking, the programmable impedance control circuit of FIG. 10 attempts to achieve a stable system during a tracking operation by limiting the code variance to one or several codes. The programmable impedance control circuit of FIG. 10 utilizes a digital code to control impedance, and can be applied to both the up driver and the down driver.

Figure 13:
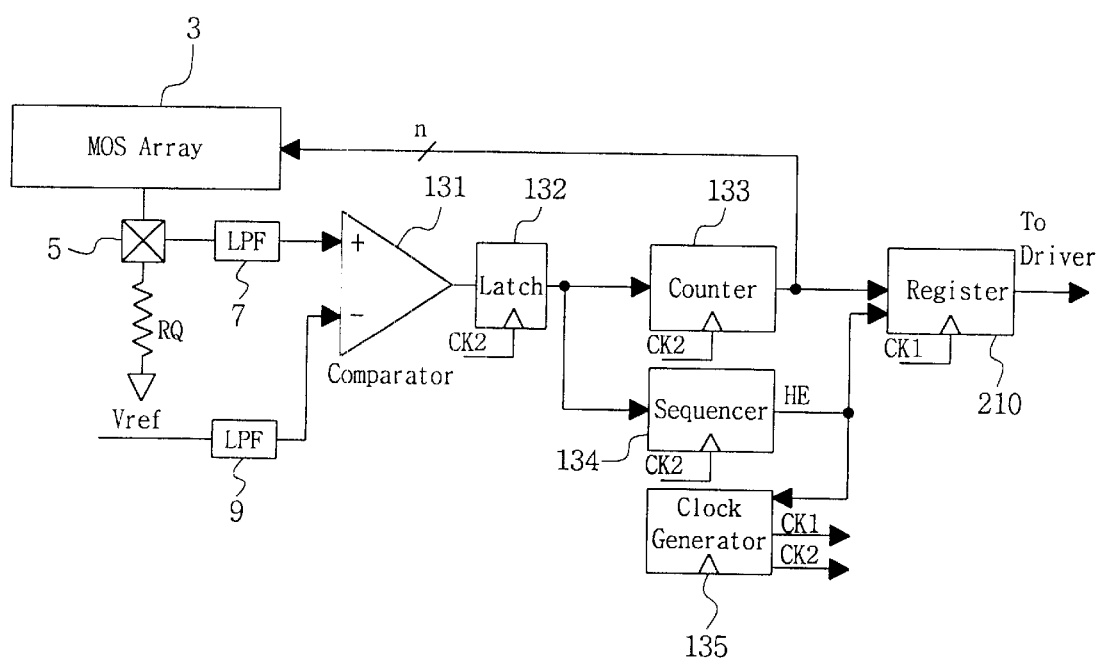
FIG. 13 is a diagram illustrating a programmable impedance control circuit according to yet another embodiment of the present invention.
Figure 14:
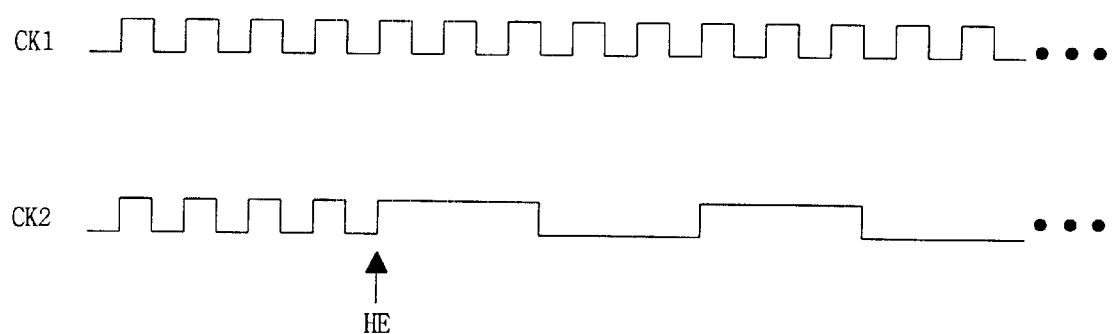
FIG. 14 is a timing diagram illustrating a clocking mechanism that is implemented in the circuit of FIG. 13.
Figure 15:
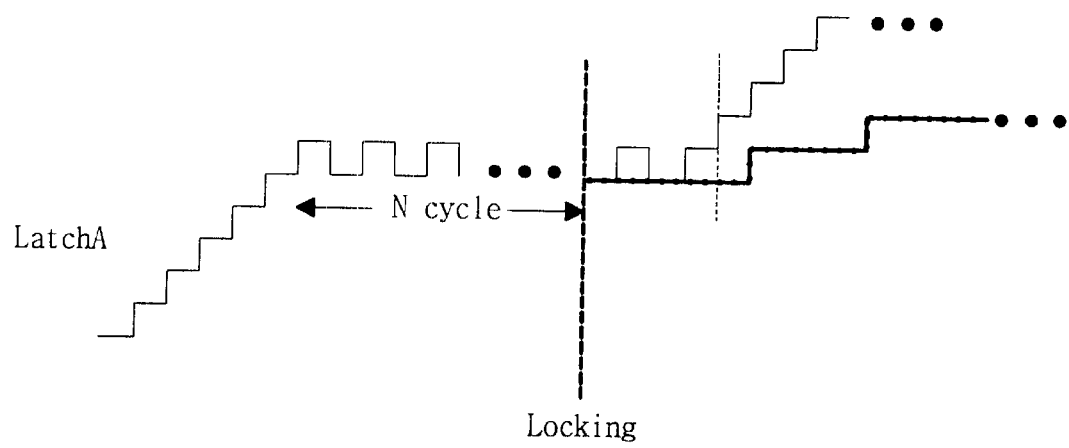
FIG. 15 is a diagram illustrating an operational mode of the programmable impedance control circuit of FIG. 13.

FIG. 13 is a diagram of a programmable impedance control circuit according to another embodiment of the present invention, wherein a time delay is implemented by the circuit to control the impedance. FIG. 14 is a timing diagram illustrating an operation of the circuit of FIG. 13 and FIG. 15 is a diagram illustrating a method of operation of the circuit of FIG. 13. In this embodiment, the programmable impedance control circuit comprises a comparator 131 for comparing a reference voltage Vref with the voltage of the pad 5 resulting from a combination of the MOS array 3 and the external resistance RQ with the reference voltage Vref to output the resultant signal. A latch 132 stores the resultant signal output from the comparator 131 and output the stored signal to a counter 133. The counter 133 performs an up/down counting operation in response to the signal value output from the latch 132 and outputs the counted value as a code signal. A sequencer 134 is provided for detecting the code output from the counter 133 to detect a locked state upon the first occurrence of a steady sequencing code during a predetermined cycle, and output a locking detecting signal HE in response thereto. During a tracking operation, a clock generator 135 is enabled by the locking detecting signal HE output from the sequencer 134. When enabled, the clock generator 135 outputs clock signals CK2 and CK1, wherein CK2 has a lower frequency than the clock signal CK1. The signal CK2 is input to the latch 132, counter 133 and sequencer 134, thereby decreasing the speed at which data output from the counter is provided via the feed back loop to the MOS array 3 so that a tracking operation is slowly implemented. A register 210 is enabled by the locking detecting signal HE output from the sequencer 134 to receive and store a code value from the counter 133 at the time of a locking. The locked code value and a tracked code value are transferred to the output driver.

During operation, the comparator 131 receives a first input, which is outputted from the pad 5 located between the MOS array 3 and the external resistor RQ connected to both the MOS array 3 and the ground voltage, and which passes through the low pass filter 7. The comparator 131 receives a second input signal resulting from a reference voltage Vref in a chip that passes through the low pass filter 9. The latch 132 receives a compared signal output from the comparator 131. The counter 133 is connected to an output of the latch 132 and outputs the counted value to the MOS array 3 and the hold register 210. The sequencer 134 receives the output value of the latch 132 and outputs the locking detecting signal (hold register enable signal HE) to the register 210. The clock generator 135 is enabled by the register enable signal HE to generate the clock signals CK1, CK2. The clock signal CK1 is input to the register 210, and the clock signal CK2 is inputted to the latch 132, counter 133 and sequencer 134.

The programmable impedance control circuit of FIG. 13 performs a similar locking operation as that of the programmable impedance control circuit of FIG. 8, except that during tracking operation, the clock generator 135 receives the hold register enable signal HE and delays the speed of the clock signal CK2, thereby delaying the speed of the feed back loop. As a result, the tracking operation is slowly performed. In other words, as shown in FIG. 14, after the initial locking operation in which the signal HE is enabled, the frequency of the signal CK2 generated in the generator 135 is decreased. Consequently, the locked code for performing a tracking is slowly varied notwithstanding that an external resistance value may be abruptly changed, resulting in a stable system. The programmable impedance control circuit of FIG. 13 can be implemented with an up driver and a down driver.

Figure 16:
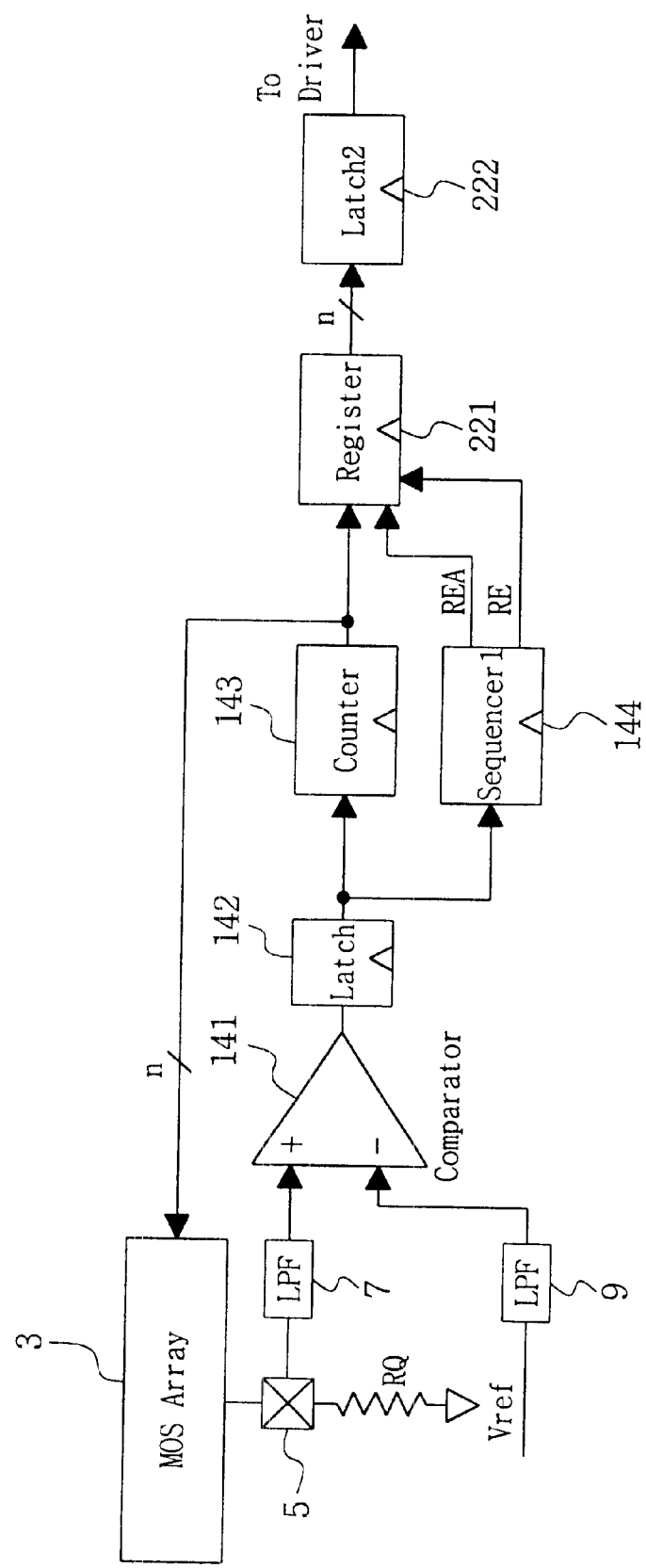
FIG. 16 is a diagram of a programmable impedance control circuit according to another embodiment of the present invention.
Figure 17:
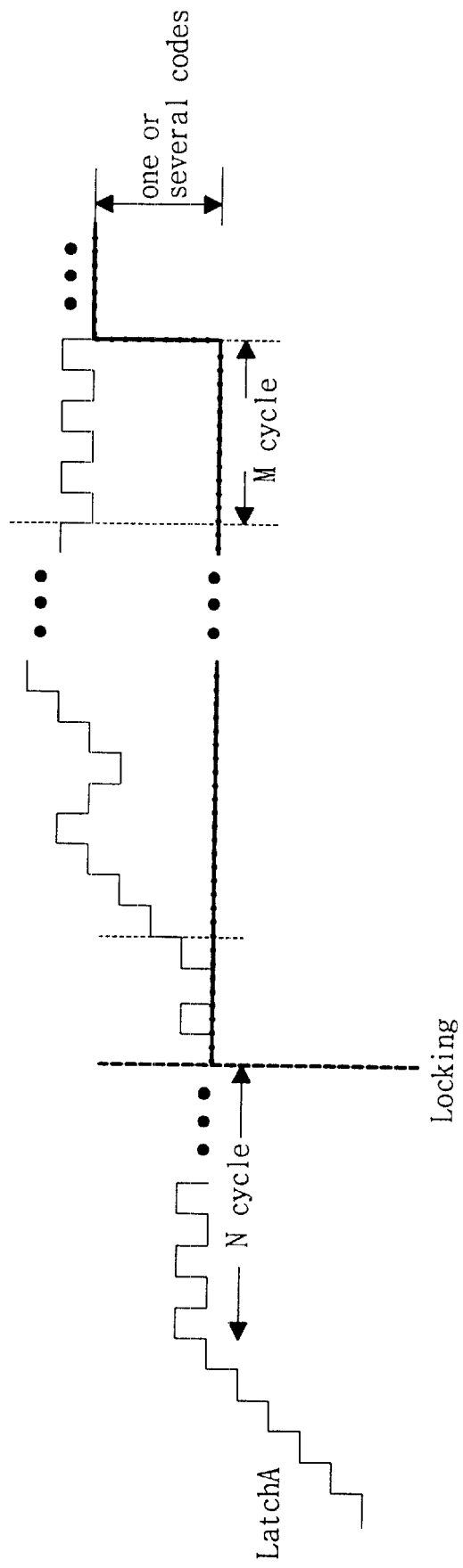
FIG. 17 is a diagram illustrating an operational mode of the programmable impedance control circuit of FIG. 16.

FIG. 16 is a diagram illustrating a programmable impedance control circuit according to yet another embodiment of the present invention and FIG. 17 is a diagram illustrating an operational mode of the circuit of FIG. 16. The programmable impedance control circuit comprises a comparator 141 for comparing a reference voltage Vref and a voltage of the pad 5 obtained from combination of the MOS array 3 and external resistance RQ and outputting a resultant signal. A latch 142 stores the resultant signal output from the comparator 141 and outputs the stored signal to a counter 143. The counter performs an up/down counting operation in response to the signal value output from the latch 142 and outputs a counted value as a code signal. A sequencer 144 is provided for outputting a first detection signal RE in response to detecting a locked state upon the occurrence of a steady-state code during a predetermined cycle. The sequence 144 outputs a second detection signal REA when another sequence of a constant code appears after the locking operation. A register 22 is enabled by the first detection signal RE output from the sequencer 144 to receive and store the locked code at the time of locking from the counter 143, and to update the locked code to another steady code if the second detection signal REA is received from the sequencer 144. A latch 222 is provided for transmitting the code value output from the register 221 to an output driver.

During operation, the comparator 141 receives a first input, which is outputted from the pad 5 located between the MOS array 3 and the external resistor RQ connected to both the MOS array 3 and the ground voltage, and which passes through the low pass filter 7. The comparator 141 receives a second input signal resulting from a reference voltage Vref in a chip that passes through the low pass filter 9. The latch 142 receives a compared signal from the comparator 141. The counter 143 is connected to an output of the latch 142 to output the counted value to the MOS array 3 and the register 221. The sequencer 144 receives the output value of the latch 142. The sequence 144 generates the first register enable signal RE upon the initial locked state and then generates the second register enable signal REA upon the occurrence of another steady sequencing code state. The register 221 receives the output of the counter 143 and the sequencer 144. The latch 222 receives the output of the register 221.

The programmable impedance control circuit of FIG. 16 performs a locking operation in response to detecting a steady-state sequencing code of N cycles using the signal RE similar to the programmable impedance control circuit of FIG. 8. Thereafter, the circuit of FIG. 16 will maintain the code value during a give period of time. When another steady-state sequencing code of M cycles is detected during a tracking operation, the locked code value in the register 221 will be updated (by one or several codes) by outputting the signal REA to the register 221. In other words, the circuit of FIG. 16 will updates the value of the register by performing a tracking with a steady code value if a steady sequencing period (of M cycles) appears after the locking operation. In this embodiment, preferably, the tracking is abruptly implemented since the tracking to another steady code value is tracked at a time after a locking operation. The programmable impedance control circuit of FIG. 16 may be implemented with an up or down driver.

Figure 18:
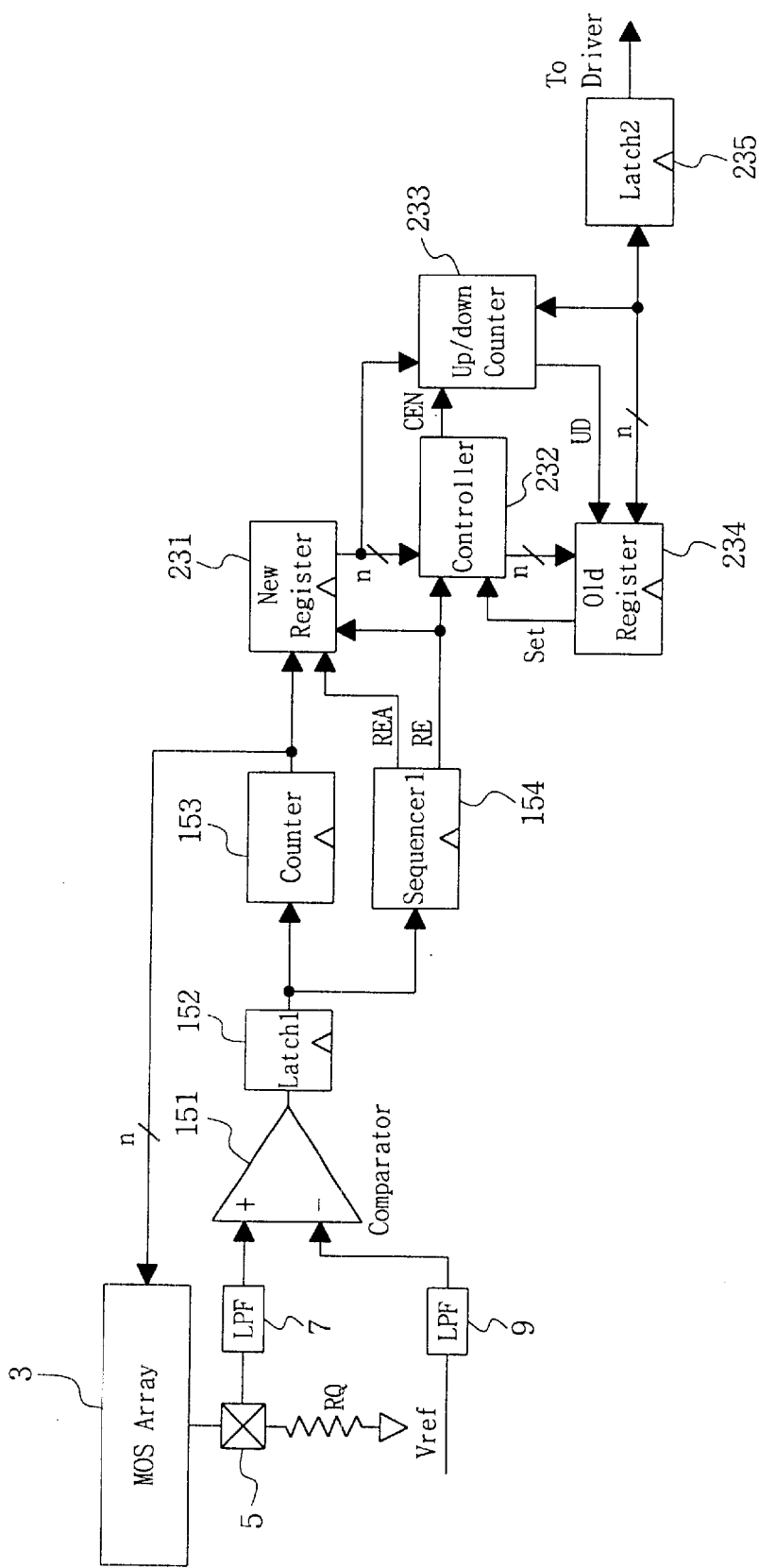
FIG. 18 is a diagram of a programmable impedance control circuit according to yet another embodiment of the present invention.
Figure 19:
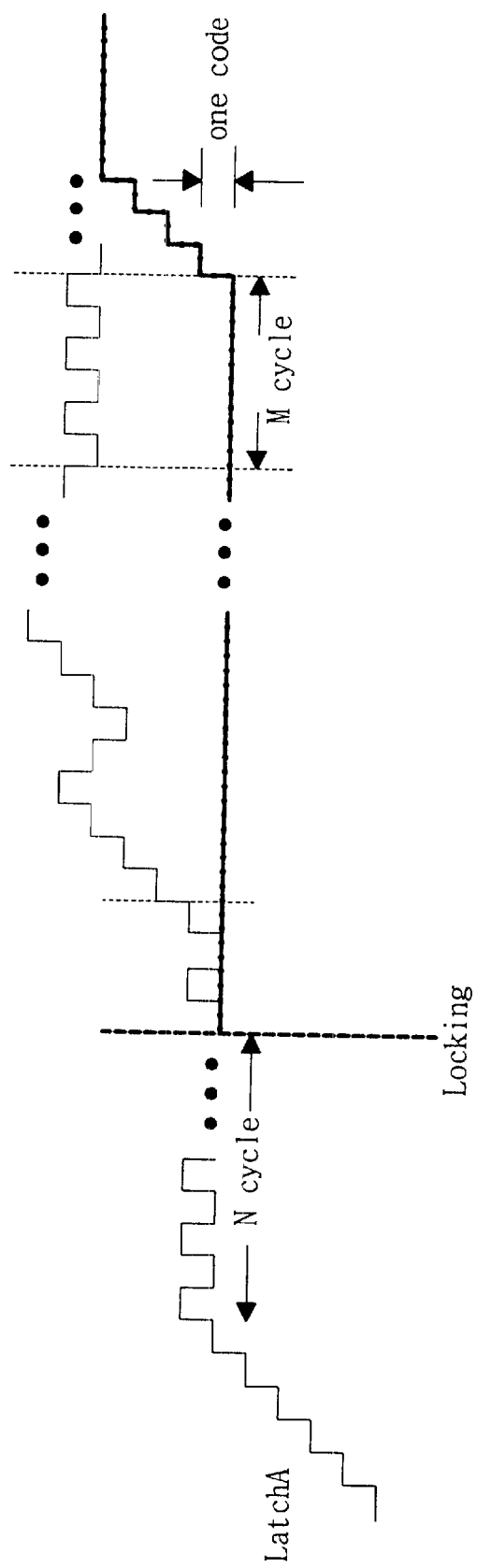
FIG. 19 is a diagram illustrating an operational mode of the programmable impedance control circuit of FIG. 18.

Referring now to FIG. 18, a diagram illustrates a programmable impedance control circuit according to another embodiment of the present invention. FIG. 19 is a diagram illustrating a mode of operation of the circuit of FIG. 18. The programmable impedance control circuit of FIG. 18 comprises a comparator 151 for comparing a reference voltage Vref with the voltage of the pad 5 obtained from a combination of the MOS array 3 and external resistance RQ and outputting a resultant signal. A latch 152 stores the resultant signal output from the comparator 151 and outputs the stored signal to a counter 153. The counter 153 performs an up/down counting operation in response to the output value from the latch 152 and outputs the counted value as a code signal. A sequencer 154 outputs the first detection signal RE in response to detecting a locked state upon the occurrence of an initial steady sequencing code during a predetermined cycle. The sequence 154 outputs a second detection signal REA when another constant sequencing code is detected after the locking. A new register 231 is enabled by the first detection signal RE output from the sequencer 154 to receive and store the locked code from the counter 153 at the time of locking. The new register 231 will output an updated code value as other steady code state if the second detection signal outputted from the sequencer 154 is received while updating the code value even after the locking is implemented. An old register 234 is provided for storing and outputting the code value locked through a controller 232, and at the same time for storing and outputting new code values generated by counting up or down the locked code value when the count up or down signal is received from an up/down counter 233. The controller 232 is connected to the new register 231 and the old register 234 to transfer the locked code value from the new register 231 to the old register 234. The controller 232 outputs a counter enable signal CEN to the up/down counter 233 to enable the counter 233 to count up or count down the old value of the old register 234 until the value becomes identical to the new value of the new register which is updated to other steady code value. The controller 232 disables the electrical path connecting the new register 231 and the old register 234 when the first detection signal RE is received. A latch 235 is provided for transmitting the code value outputted from the old register 234 to an output driver.

During operation, the comparator 151 receives a first input, which is outputted from the pad 5 located between the MOS array 3 and the external resistor RQ and connected to both the MOS array 3 and the ground voltage, and which passes through a low pass filter 7. The comparator 151 receives a second input signal resulting from a reference voltage Vref in a chip that passes through the low pass filter 9. The latch 152 receives a compared signal of the comparator 151. The counter 153 is connected to an output of the latch 152 to output the counted value to the MOS array 3 and the new register 231. The sequencer 154 receives the output value of the latch 152, and outputs the first register enable signal RE upon the initial locked state and outputs the second register enable signal REA to the new register 231 upon the occurrence of another steady sequencing code state during tracking. The new register 231 receives outputs of the counter 153 and the sequencer 154. The controller 232, which is connected to the new register 231 and the old register 234, moves the counted value (n bits) stored in the new register 231 into the old register 234, and cuts off the path connecting the new register 231 and the old register 234 by stopping its operation in response to the signal RE output from the sequencer 154. In response to the enable signal CEN output from the controller 232, the up/down counter 233 will output an up or down signal (UD) to the old register 234 for counting up or counting down the value of the old register 234 by one bit until the value of the old register 234 becomes identical to the value of the new register 231. The latch 235 is connected to an output (n bits) of the old register 234. The signal that is output from the old register 234 to the latch 235 is also input to the up/down counter 233.

The programmable impedance control circuit of FIG. 18 performs a locking operation in response to detecting a steady sequencing codes of N cycle similar to the locking operation of the programmable impedance control circuit of FIG. 8. In this case, the operation is performed as follows.

Referring to FIG. 19, after detecting a constant code sequence of N cycles, the initial locked code is stored in the new register 231 and in the old register 234 under control of the controller 232. When the register enable signal RE of the sequencer 154 is inputted to the controller 232, the controller outputs the enable signal CEN to the up/down counter 233 and electrically cuts off the connecting path between the new register 231 and old register 234. As a result, since the locked code value is stored only in the old register 234, the code value is continuously maintained. Meanwhile, the new register 231 continues to update the code value even after a locking operation. Thereafter, if another steady sequencing code state of M cycle is detected in a tracking operation, the sequencer 154 outputs the signal REA to the new register 231 and the value of the new register 231 is updated. And at the same time, the value of the old register 234 is counted up or down by one bit by the up/down signal UD outputted from the up/down counter until it becomes identical to the new value of the new register 231. Accordingly, the programmable impedance control circuit of FIG. 18 performs a tracking operation, not at a one give time and abruptly, but gradually by one code, thereby preventing an instability due to an abrupt tracking operation. This embodiment may be applied to up and down drivers.

Figure 20:
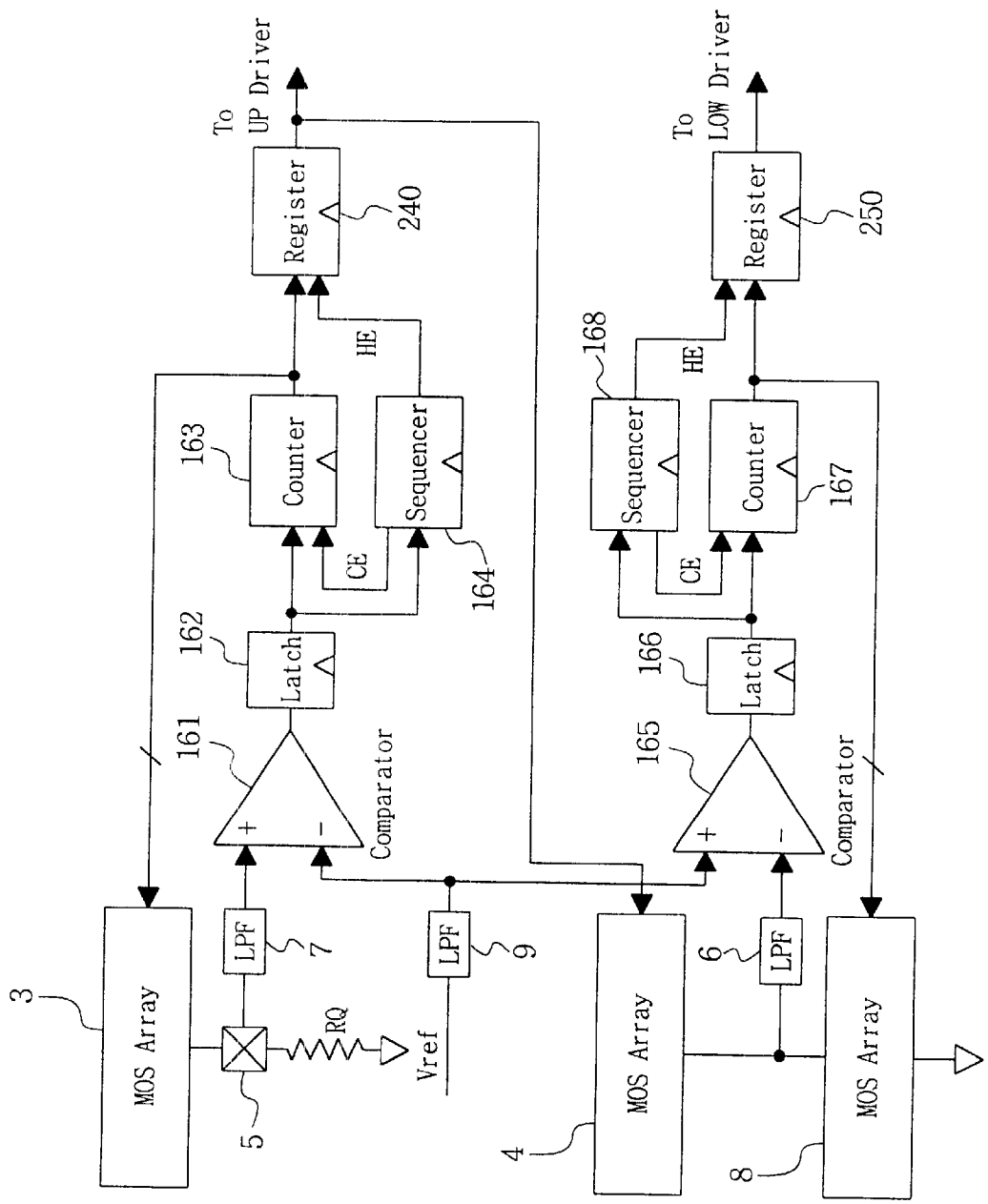
FIG. 20 is a diagram of a programmable impedance control circuit according to another embodiment of the present invention.

FIG. 20 is a diagram illustrating a programmable impedance control circuit according to yet another embodiment of the present invention. The circuit locks a pull up and a pull down. The circuit comprises a first (upper) section having an architecture similar to the embodiment of FIG. 8, and a lower section which serves to receive by feed back the value predetermined in the upper circuit and lock the pull down to the predetermined value. More specifically, the upper circuit locks the code value by a pull up to thereby output the code value to the up driver, and the lower circuit locks the code value by a pull down to thereby output the code value to the down driver. Thus the programmable impedance control circuit according to the present invention can be applied to both the up/ down drivers.

In summary, a programmable impedance control circuit may operate in one a various modes according to the present invention. In general, after locking a code value at a period in which a steady sequencing state is first detected, an independent tracking operation is performed in a manner that is separate and distinct from the prior locking operation. That is, as shown in FIG. 2, blocks 100 and 200 operate independently from each other, and the locked code value is controlled by block 200 according to a predetermined protocol irrespective of changes block 100. In one mode of operation, subsequent to a locking operation in which a code is locked, the locked code is maintained during a chip operation without a tracking operation. That is, the locked code is not changed.

In another mode of operation, subsequent to a locking operation in which a code is locked, a tracking operation is implemented by limited values (one code or several codes) from the locked code.

In yet another mode of operation, subsequent to a locking operation in which a code is locked, a tracking operation is implemented with a slower frequency than that of the locking operation.

In another mode of operation, subsequent to a locking operation in which a code is locked, a tracking operation is implemented by updating a locked code value when a steady sequence of code values for a predetermined number of cycles is detected. The updating may comprise an abrupt code change or updating the locked code one code at a time.

As described in the forgoing, a programmable impedance control circuit performs a locking operation of impedance in which impedance of transmission line is transferred to an output driver to match an external impedance with an internal impedance of chip. This locking process is performed during the initial operation of the system. In contrast, in response to the changes in the external environments such as voltage and temperature, the circuit of the invention serves to control the impedance of transmission line by a desirable value.

Although illustrative embodiments have been described herein with reference to the accompanying drawings, it is to be understood that the present invention is not limited to those precise embodiments, and that various other changes and modifications may be affected therein by one skilled in the art without departing from the scope and spirit of the invention. It is to be understood that all such changes and modifications are intended to be included within the scope of the invention as defined by the appended claims.

What is claimed is:

1. A method for providing impedance control to match an external impedance to an internal impedance of an integrated circuit chip, the method comprising:

detecting an impedance control signal indicative of an external impedance value;

performing a locking operation to detect a locked state and output a corresponding locked code value to set an initial internal impedance, upon detecting a first occurrence of a steady code sequence in the impedance control signal for a first predetermined cycle; and performing a preprogrammed tracking operation in response to a variation of an external impedance subsequent to the locking operation.

2. The method of claim 1, wherein the preprogrammed tracking operation comprises maintaining the locked code value irrespective of variations of the external impedance subsequent to the locking operation.

3. The method of claim 1, wherein the preprogrammed tracking operation comprises adjusting the value of the initially set internal impedance by no more than a predefined number of code values from the locked code value.

4. The method of claim 1, wherein the preprogrammed tracking operation comprises performing the tracking operation at a clock frequency that is lower than a clock frequency at which the locking operation is performed.

5. The method of claim 1, wherein the preprogrammed tracking operation comprises:

maintaining the locked code value; and changing the locked code value to an updated code value after detecting an occurrence of a steady code sequence in the impedance control signal for a second predetermined cycle subsequent to the locking operation.

6. The method of claim 5, wherein the step of changing the locked code value to the updated code value comprises abruptly changing the locked code value to a code value corresponding to the steady code value.

7. The method of claim 5, wherein the step of changing the locked code value to the updated code value comprises gradually adjusting a code value from the locked code value to a code value corresponding to the steady code.

8. The method of claim 1, wherein the method is implemented for matching the characteristic impedance of a transmission line to the impedance of an output driver.

9. A programmable impedance control circuit, comprising:

a first circuit for processing a plurality of reference voltages to generate an impedance control signal and for performing a locking operation to detect a locked state and output a corresponding locked code value upon detecting a first occurrence of a steady code sequence in the impedance control signal for a first predetermined cycle; and a second circuit for storing the locked code value output from the first circuit and for performing a preprogrammed tracking operation in response to a variation in an external impedance subsequent to the locking operation.

10. The programmable impedance control circuit of claim 9, wherein the programmable impedance control circuit is implemented to match the characteristic impedance of a transmission line to the impedance of an output driver.

11. The programmable impedance control circuit of claim 9, further comprising:

a MOS array, operatively connected to the first circuit, wherein the MOS array comprises a plurality of transistors that are selectively enabled and disabled in response to the impedance control signal generated by the first circuit to adjust the effective impedance of the MOS array, wherein the MOS array is further coupled to an external impedance, and wherein the MOS array and the external impedance effectively establish a first reference voltage that is processed by the first circuit to generate the impedance control signal.

12. The programmable impedance control circuit of claim 9, wherein the first circuit comprises:

a comparator for comparing a first reference voltage with a second reference voltage to generate a first control signal;

a latch for storing the first control signal output from the comparator;

a counter for performing an up/down counting operation in response to the first control signal output from the latch to generate the impedance control signal; and a sequencer for processing the first control signal to detect the locked state, and for generating a locking detection signal to terminate operation of the counter upon detecting the locked state.

13. The programmable impedance control circuit of claim 12, wherein the second circuit comprises a register, operatively enabled by the locking detecting signal, for receiving and storing the locked code value of the impedance control signal output from the counter.

14. The programmable impedance control circuit of claim 13, further comprising:

a third circuit comprising the first and second circuits, wherein the third circuit locks a code value by a pull up to output the code value to an up driver; and a fourth circuit comprising the first and second circuits, wherein the fourth circuit locks a code value by a pull down to output the code value to a down driver.

15. The programmable impedance control circuit of claim 9, wherein the first circuit comprises:

a comparator for comparing a first reference voltage with a second reference voltage to generate a first control signal;

a latch for storing the first control signal output from the comparator;

a counter for performing an up/down counting operation in response to the first control signal output from the latch to generate the impedance control signal;

a sequencer for processing the first control signal to detect the locked state and outputting a locking detection signal in response to detecting the locked state; and a limiter, operatively enabled by the locking detecting signal, to generate a counter control signal to control the output of code values from the counter during a tracking operation so that the tracking operation is implemented by no more than a predetermined number of code values from the locked code value.

16. The programmable impedance control circuit of claim 15, wherein the second circuit comprises a register, operatively enabled by the locking detection signal, for receiving and storing a locked code value output from the counter.

17. The programmable impedance control circuit of claim 9, wherein the first circuit comprises:

a comparator for comparing a first reference voltage with a second reference voltage to generate a first control signal;

a latch for storing the first control signal output from the comparator;

a counter for performing an up/down counting operation in response to the first control signal output from the latch to generate the impedance control signal;

a sequencer for processing the first control signal to detect the locked state and outputting a locking detection signal in response to detecting the locked state; and a clock generator, operatively enabled by the locking detection signal, to reduce the clock signal frequency input to the latch, counter and sequencer after the locking operation so that the tracking operation is implemented at a lower rate than the locking operation.

18. The programmable impedance control circuit of claim 17, wherein the second circuit comprises a register, operatively enabled by the locking detection signal, for receiving and storing the locked code value output from the counter.

19. The programmable impedance control circuit of claim 9, wherein the first circuit comprises:

a comparator for comparing a first reference voltage with a second reference voltage to generate a first control signal;

a first latch for storing the first control signal output from the comparator;

a counter for performing an up/down counting operation in response to the first control signal output from the latch to generate the impedance control signal; and a sequencer for processing the first control signal to detect the locked state, and for generating a first detection signal upon detecting the locked state, and for generating a second detection signal upon detecting the occurrence of a steady code sequence in the first control signal subsequent to detecting the locked state.

20. The programmable impedance control circuit of claim 19, wherein the second circuit comprises:

a register being operatively enabled by the first detection signal to receive and store the locked code from the counter during the locking operation, and being operatively enabled by the second detection signal to change the locked code value to an updated code value corresponding to a steady code sequence detected in the first control signal subsequent to the locked state; and a second latch for storing the updated code value output from the register.

21. The programmable impedance control circuit of claim 19, wherein the second circuit comprises:

a first register;

a second register;

wherein the first register is operatively enabled by the first detection signal to receive and store the locked code from the counter during the locking operation, and operatively enabled by the second detection signal to change the locked code value to an updated code value corresponding to a steady code sequence detected subsequent to the locked state;

a controller operatively connected to the first register and second register, wherein in response to the first detection signal, the controller transfers the locked code value from the first register to the second register, outputs a counter enable signal and then electrically terminates a path connecting the first and second registers;

an up/down counter, operatively enabled by the counter enable signal output from the controller, for performing an up/down counting operation to adjust the code value in the second register to be similar to the code value in the first register when the locked code value is updated during the tracking operation;

wherein the second register stores and outputs the locked code value transferred from the first register by the controller, and wherein the second register stores and outputs an updated code value provided by the up/down counter; and a second latch for storing and outputting a code value received from the second register.

22. A method for providing impedance control to match an external impedance to an internal impedance of an integrated circuit chip, the method comprising:

performing a locking operation upon detecting a steady code sequence in a impedance control signal for a predetermined time period; and performing a preprogrammed tracking operation subsequent to the locking operation in response to a variation of the external impedance, wherein the preprogrammed tracking operation is executed independent of the variation in the external impedance.

* * * * *